United States Patent
Yamamoto et al.

[11] Patent Number: 5,821,455
[45] Date of Patent: Oct. 13, 1998

[54] LID WITH VARIABLE SOLDER LAYER FOR SEALING SEMICONDUCTOR PACKAGE, PACKAGE HAVING THE LID AND METHOD FOR PRODUCING THE LID

[75] Inventors: Tetsuya Yamamoto, Mine; Hideyuki Yoshino, Ube; Akihiro Hidaka, Yoshiki-gun, all of Japan; Roy Bell, Gilbert, Ariz.; Rusli Othman, Kedah, Malaysia

[73] Assignees: Sumitomo Metal (SMI) Electronics Devices, Inc., Yamaguchi, Japan; Intel Corporation, Santa Clara, Calif.

[21] Appl. No.: 790,577

[22] Filed: Jan. 29, 1997

Related U.S. Application Data

[63] Continuation-in-part of Ser. No. 232,709, Apr. 25, 1994, abandoned.

[30] Foreign Application Priority Data

Apr. 26, 1993 [JP] Japan ................................... 5-123366
Dec. 9, 1993 [JP] Japan ................................... 5-341752

[51] Int. Cl.⁶ ........................................................ H05K 5/00
[52] U.S. Cl. ........................................ 174/52.1; 174/52.3
[58] Field of Search .................................. 257/704, 778, 257/779; 428/620, 637, 645; 361/820; 29/840; 174/52.3, 52.4, 52.1; 228/121, 123.1, 124.1

[56] References Cited

U.S. PATENT DOCUMENTS

| | | | |
|---|---|---|---|
| 4,356,047 | 10/1982 | Gordon et al. | 156/89 |
| 4,626,960 | 12/1986 | Hamano et al. | 361/708 |
| 4,746,583 | 5/1988 | Falanga | 428/632 |
| 5,057,376 | 10/1991 | Sunahara et al. | 428/432 |
| 5,414,300 | 5/1995 | Tozawa et al. | 257/704 |

FOREIGN PATENT DOCUMENTS

| | | | |
|---|---|---|---|
| 62-265743 | 11/1987 | Japan | H01L 23/02 |
| 3-10541 | 1/1991 | Japan . | |
| 3-10542 | 1/1991 | Japan . | |
| 3-10543 | 1/1991 | Japan . | |
| 6-140523 | 5/1994 | Japan . | |

*Primary Examiner*—Kristine L. Kincaid
*Assistant Examiner*—Kristina Soderquist
*Attorney, Agent, or Firm*—Flynn, Thiel, Boutell & Tanis, P.C.

[57] ABSTRACT

A lid for sealing a semiconductor package containing a semiconductor chip, a semiconductor package making use of the lid, and a method for producing the lid. The lid has a solder layer along the peripheral side of a ceramic plate. The solder layer has a portion of an increased solder thickness and a portion of a reduced solder thickness extending along the peripheral direction. When sealing the semiconductor package, a gas confined within the inside of the semiconductor chip mounting site of the package substrate may be discharged from the semiconductor package for realizing hermetic sealing.

19 Claims, 12 Drawing Sheets

LID WITH VARIABLE SOLDER LAYER FOR SEALING SEMICONDUCTOR PACKAGE, PACKAGE HAVING THE LID AND METHOD FOR PRODUCING THE LID

This is a continuation-in-part of Ser. No. 08/232 709, filed Apr. 25, 1994, now abandoned.

BACKGROUND OF THE INVENTION

1. Field of the Invention

This invention relates to a lid for sealing a semiconductor package, a semiconductor package having such a lid, and a method for producing the lid. More particularly, it relates to a lid for sealing a semiconductor package in which, mounting a semiconductor chip, such as an IC chip or an LSI chip, on a semiconductor mounting site of a package substrate, and to a method for hermetically sealing the semiconductor chip. This invention makes it possible to reduce the volume of a gas confined in the chip mounting site and prevent the solder under the inner gas pressure, or prevents the splashed solder, from smearing on or splashing on the package substrate or external connection terminals.

2. Description of the Prior Art

Figure 16A:
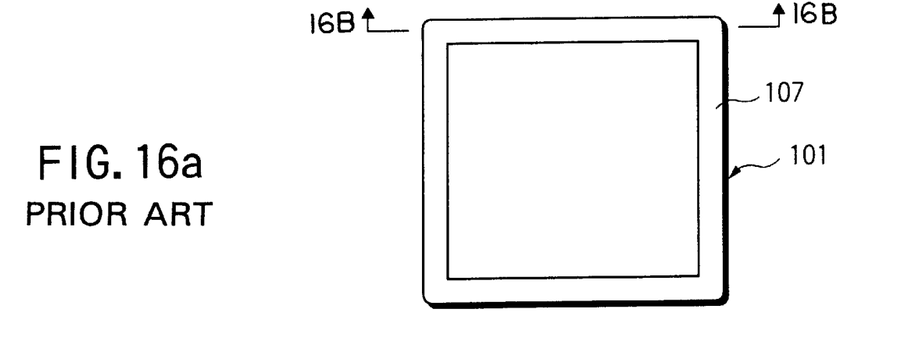
FIG. 16a is a plan view of a lid.
Figure 16B:
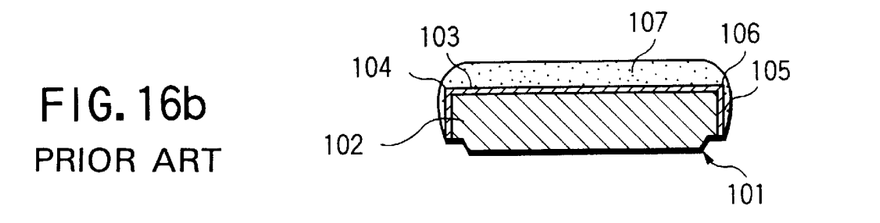
FIG. 16b is a cross-section view taken on a line I—I of FIG. 16a and FIG. 16c is a cross-sectional view showing a sealed state of a semiconductor package.
Figure 16C:
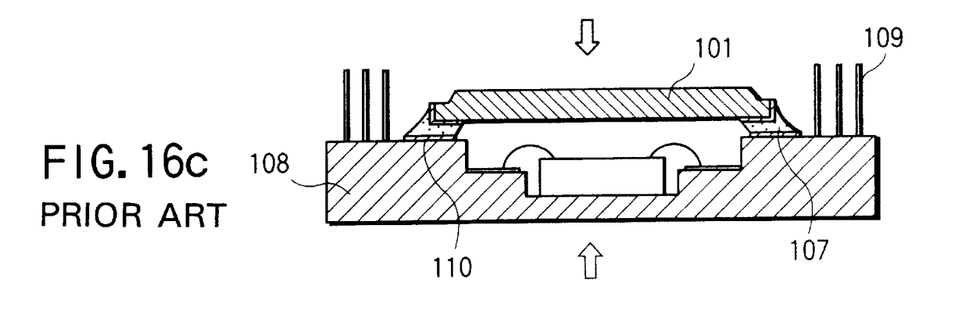

Referring to FIG. 16, a lid 101 for sealing a semiconductor package includes an underlying metallized layer 106 on a peripheral side 104 and on a lateral side 105 of one major surface 103 of a ceramic plate 102, and a solder layer 107 on the metallized layer 106. The lid 101 may be bonded via the solder layer 107 with a package substrate 108 for hermetically sealing the semiconductor chip mounted on a semiconductor chip mounting site of the package substrate 108, called a "cavity".

For hermetically sealing the package substrate 108 using the lid 101, the solder layer 107 is caused to face an underlying metallized layer 110 provided on the upper surface of the package substrate 108 and the lid 101 is thrust and secured to the package substrate 108, having the semiconductor chip mounted thereon, with the solder in the solder layer 107 being fused in a furnace to effect the sealing.

Figure 17:
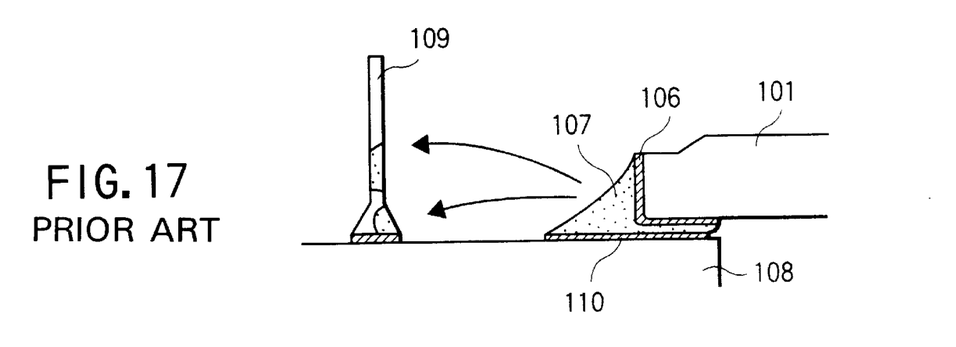
FIG. 17 illustrates the state of solder scattering.

However, with the above arrangement, during the sealing of the package substrate 108, the fusible solder of the solder layer 107 tends to splash under the inner pressure and deposit on the surface of the package substrate 108 or on external connection terminals 109. The splashed solder may obstruct the insertion of the connection terminals into a mounting substrate or produce contamination, as shown in FIG. 17. This is possibly ascribable to the gas discharged from the inside of the package.

It has also been proposed in Japanese Utility Model Laid-Open Nos. 3-10541, 3-10542 and 3-10543 to provide a sealant formed of a mixture of an epoxy resin, low-melting glass powders and an organic solvent on one surface of a lid for hermetically sealing the semiconductor chip mounting site of a package substrate, wherein a cut-out is formed in the sealant for discharging the gas evolved from the organic substance in the sealant into the atmosphere. It seems that a cut-out in a portion of the epoxy resin sealant is also effective for discharging the gas confined within the package substrate into the atmosphere.

Therefore, by providing a cut-out in a portion of the solder layer of a lid, used as a sealant, it is possible to discharge the gas to the atmosphere during hermetic sealing of the semiconductor chip mounting site of the package substrate.

However, when the cut-out is formed in a portion of the solder layer, the following problems arise.

(i) Since the metallized layer is exposed on the surface of the cut-out, the flow of the fusible solder of the solder layer is retarded so as to make it impossible to fill up the deep cut-out with the fusible solder quickly and perfectly enough.

(ii) It is difficult to form such a cut-out as a gas vent hole.

(iii) A solder showing good flowability at the sealing temperature needs to be employed.

SUMMARY OF THE INVENTION

It is an object of the present invention to provide a semiconductor package sealing lid which is free of the defects of the prior-art lid, a package having such a lid and a method for producing the lid.

It is another object of the present invention to provide a semiconductor package sealing lid, with which it is possible to discharge the gas confined within the inside of the semiconductor chip mounting site of package substrate during heating for sealing, in order to reduce the amount of the remaining gas and improve the hermetic sealing of the semiconductor package, a package having such a lid and the method for producing the lid.

It is a further object of the present invention to provide a method for producing a semiconductor package sealing lid whereby a solder layer having a solder thickness gradient or solder thickness difference may readily be attained.

With the semiconductor package sealing lid of the present invention, the solder layer on the peripheral side of a ceramic plate constituting the lid has a portion of an increased solder thickness and a portion of a reduced solder thickness along the periphery of the ceramic plate, in order to provide a thickness gradient or a thickness difference in the solder layer. In this manner, when the semiconductor package is sealed, the gas confined in the inside of the semiconductor chip mounting site of the package substrate may be smoothly discharged out of the semiconductor package to assure accurate hermetic sealing.

Also the hermetically sealed semiconductor device may be fabricated by employing the above-mentioned semiconductor package sealing lid.

According to the present invention, the underlying metallized layer on the peripheral side of the ceramic plate has a narrow width portion and a wide width portion. A solder layer having a solder thickness gradient or a solder thickness difference may be accurately formed on the underlying metallized layer by wetting and spreading the solder layer with a width corresponding to that of the underlying metallized layer.

The above and other objects, features and usages of the present invention will become more clear on reading the following description in conjunction with the accompanying drawings.

BRIEF DESCRIPTION OF THE DRAWINGS

FIG. 14b is a cross-sectional view taken on a line I—I of FIG. 14a.

FIG. 14c is a cross-sectional view taken on a line J—J of FIG. 14a.

FIG. 16a, 16b and 16c show a conventional structure, in which

DETAILED DESCRIPTION OF THE PREFERRED EMBODIMENTS

Referring to the drawings, three illustrative embodiments of the present invention will be described in detail.
Embodiment 1

Figure 1A:
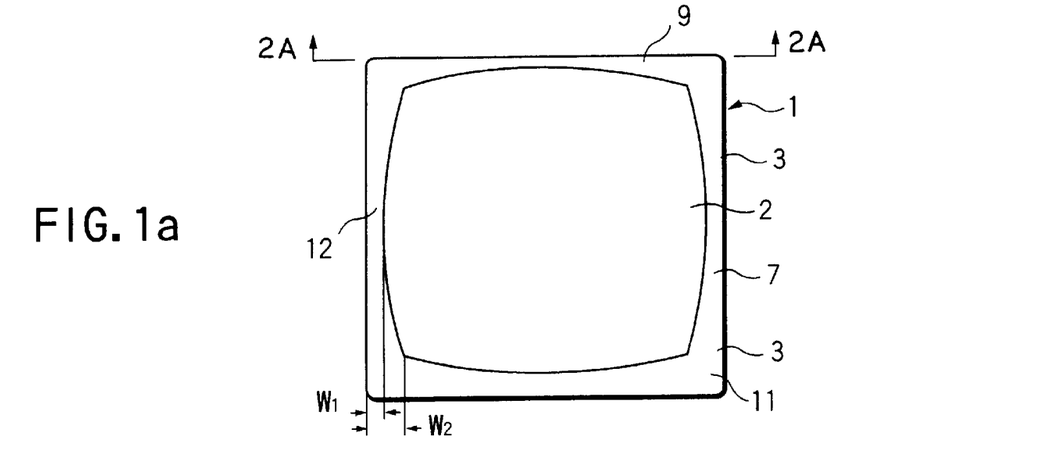
FIGS. 1a, 1b and 1c are plan views each showing a surface of a semiconductor package sealing lid provided with a solder layer according to an embodiment of the present invention.
Figure 1B:
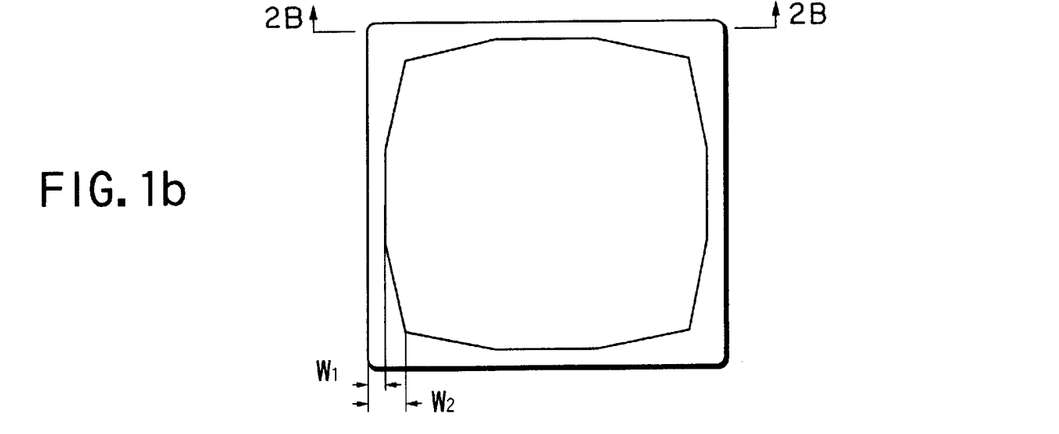
Figure 1C:
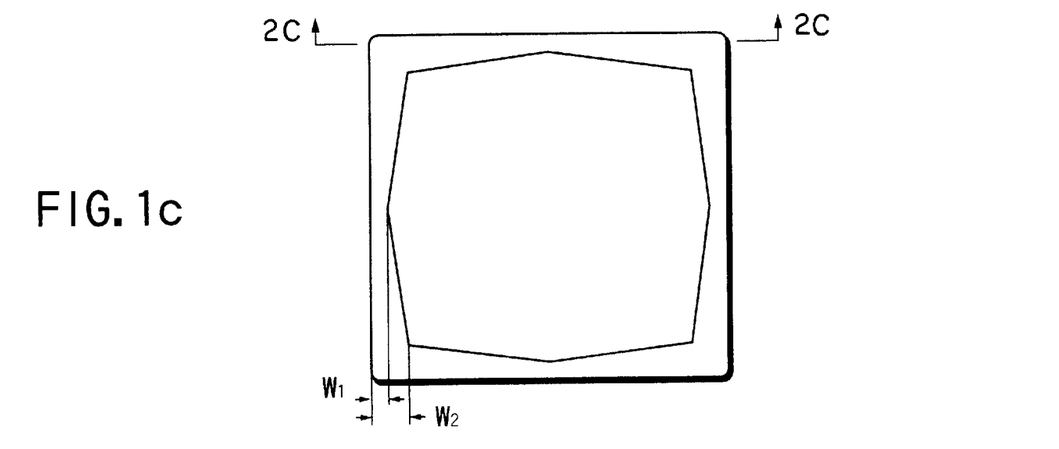
Figure 2A:
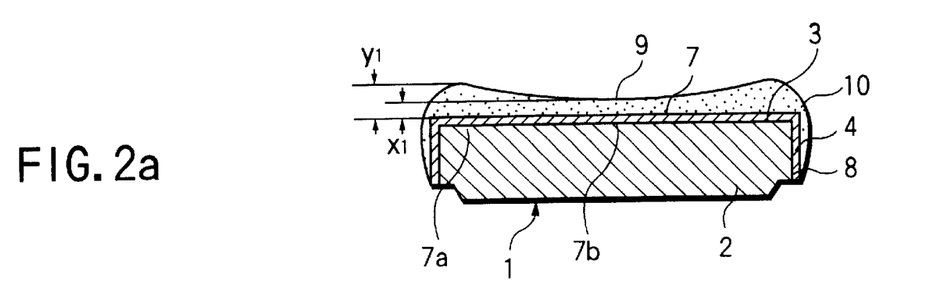
FIGS. 2a, 2b and 2c are cross-sectional views taken along lines A—A, B—B and C—C of FIGS. 1a, 1b and 1c, respectively.
Figure 2B:
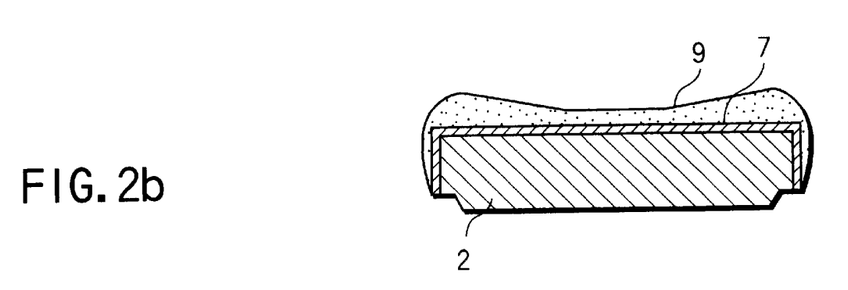
Figure 2C:
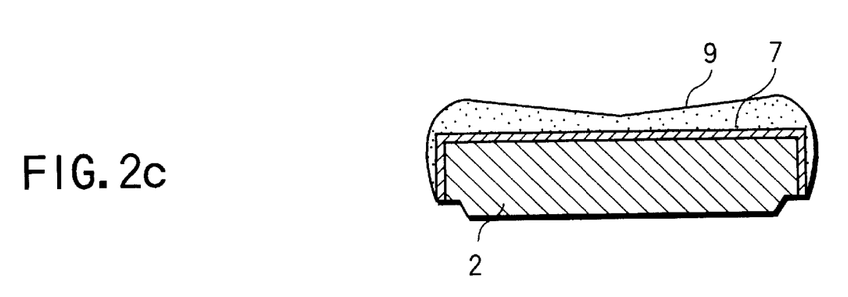

Referring to FIGS. 1 and 2, a lid 1 for a semiconductor package of the present embodiment includes an underlying metallized layer 7 along the periphery 3 on one side of a ceramic plate 2, an underlying metallized layer 8 on its lateral sides 4, a solder layer 9, as a sealant, on the underlying metallized layer 7 and a solder layer 10 on the underlying metallized layer 8. The solder layer 9 has a thickness gradient which is raised along the periphery on one side of a ceramic plate. The underlying metallized layers 7, 8 are formed by coating a paste containing one or more metals such as Ag, Ag—Pt, Ag—Pd, Mo—Mn, Mo, W or Ti by screen printing on the layers 7, 8 and firing the resulting assembly. Ag—Pt metal is most preferred. By employing this metal, the solder may wet and be spread more satisfactorily. When Mo—Mn, Mo, W, or Ti is employed, Ni is plated on the metallized layer, and Au is further plated on the Ni plating. The metallization is of a thickness of 10 to 20 $\mu$m. The solder layer 9 is composed of Pb, Sn, In, Bi, Ag and Sb, at least in part, and has a melting point of 250° C. or higher. The reason the underlying metallized layer 8 is formed on the lateral sides of the ceramic plate 4 and the solder layer 10 is formed on the metallized layer 8 is that a well-defined meniscus of the solder layer may be formed between the lid 1 and the sealing surface of the package substrate to improve the sealing. However, the underlying metallized layer 8 and the solder layer 10 formed on the lateral sides of the ceramic plate 4 may be eliminated, if so desired.

The underlying metallized layer 7 on the ceramic plate 2 along its periphery has a portion of wide width and a portion of narrow width. The solder layer 9 is formed on the underlying metallized layer 7. The solder layer on the wide width portion of the underlying metallized layer 7 is greater in thickness than the narrow width portion of the solder layer, and a gradient of the solder thickness is formed by a smooth slope or straight lines between the two portions.

Figure 3:
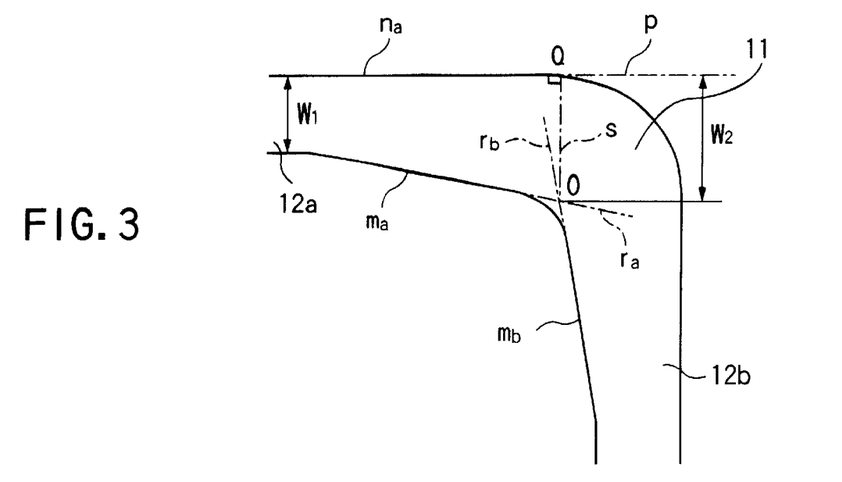
FIG. 3 is an enlarged part view illustrating the positions of measurement of the widths $w_1$, and $w_2$ of the metallized layer according to the present invention.

In the present embodiment, a width $w_2$ of the metallized layer at a corner 11 is set so as to be wider than a width $w_1$ of the metallized layer at a mid portion 12 on a peripheral side between two neighboring corners. The width $w_2$ of the metallized layer at the corner 11 and the width $w_1$ of the metallized layer at the mid portion 12 of the peripheral side are preferably set so that the ratio $w_2/w_1$ is in a range of 1.1 to 1.7, and the transition from the mid portion 12 to the corner 11 is so set that the width $w_1$ is changed to the width $w_2$ smoothly and continuously. For example, the widths $w_1$ and $w_2$ are set to 1.8 mm and 2.5 mm, respectively with the transition from the width $w_1$ to the width $w_2$ being made by a smooth arc of a circle, a slope (FIG. 1a) or straight lines (FIGS. 1b and 1c). The solder layer 9 is formed on the upper surface of the metallized layer 7. When a ceramic plate 2 is rectangular, the underlaying metallized layer width of $w_1$ and $w_2$ is defined as follows. As shown in FIG. 3, a metallized layer width $w_1$ is measured as a distance between an outer side line na and an inner side line ma at the mid portion of the periphery 12a where the metallized layer has the least width. The width $w_2$, on the other hand, is measured as a distance of the broadest portion O—Q (lines) of the metallized layer 7 between a point of the intersection O and a point of Q. The point O is a point of intersection of a neighboring inner side line mb or the extension line thereof with a line of the inner side line ma or the extension line thereof. The point Q is a point of intersection of a perpendicular line from the point O toward a line of the outer side line na or the extension line thereof.

Referring to FIGS. 1, 2 and 3, the method for producing a lid for sealing the semiconductor package is now explained. An underlying metallized layer 7, 8 is first formed at an peripheral side 3 of the ceramic plate 2.

The width $w_2$ of the underlying metallized layer 7a is selected to be larger than the width $w_1$ of the underlying metallized layer 7b. On the underlying metallized layers 7 and 8, a solder paste of a uniform thickness is printed or coated by conventional screen printing to the same width as that of the underlying metallized layer 7 for reflowing under a nitrogen atmosphere under the conditions of a temperature of 270° C. or higher and a duration of 20 seconds, with the maximum temperature being 310° C. The solder layer may also be formed by a dipping method of dipping the lid 1 with the underlying metallized layer 7 in a soldering bath.

Since the solder has a constant wetting angle with respect to the metallized layers 7a, 7b, the solder on the metallized layer 7a after the reflow or dipping has a thickness $y_1$ larger than a thickness $x_1$ on the metallized layer 7b. Thus the ridge line of the solder layer 9 is a curve-or straight lines conforming to the widths $w_1$ and $w_2$ of the metallized layers 7a and 7b.

Figure 4:
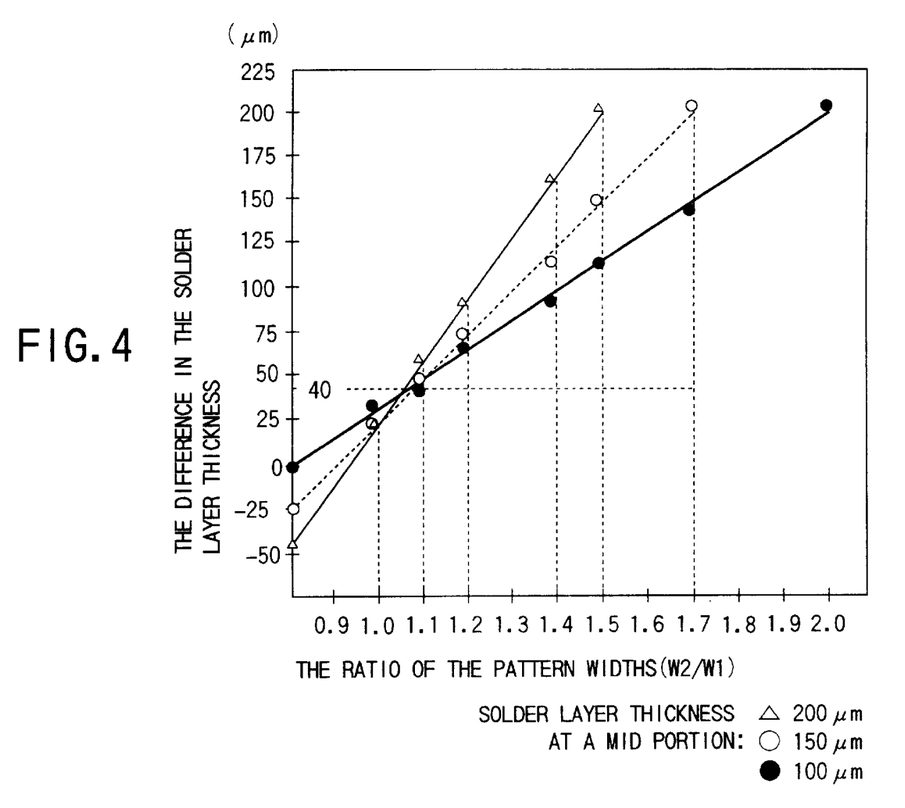
FIG. 4 is a graph illustrating the relation between the ratio of the pattern widths of underlying metallized layer and the difference in the solder layer thickness.

With the method of the present embodiment, the difference in the thickness of the solder of the solder layer may be produced by changing the width of the metallized layer 7 formed on the surface of the ceramic plate 2. That is, since the solder has, by nature, the same wetting angle with respect to the underlying metallized layer 7, the thickness of the solder of the solder layer may be controlled by the width of the metallized layer 7. The thickness gradient of the solder layer may be easily formed along the periphery of the solder layer. Meanwhile, in order to confirm the relation between the width of the metallized layer 7 and the thickness of the solder layer, a solder layer was formed on the underlying metallized layer 7 having a varying width and the thickness of the solder layer for each value of the metallized layer width was measured. It was confirmed that the difference in the thickness of the solder was proportionate to the ratio of the width of the underlying metallized layer 7, as shown in FIG. 4. Consequently, with the present embodiment, a ceramic lid having the gradient of the solder thickness of the desired shape may be produced without adding other thickness gradient forming means.

Figure 5:
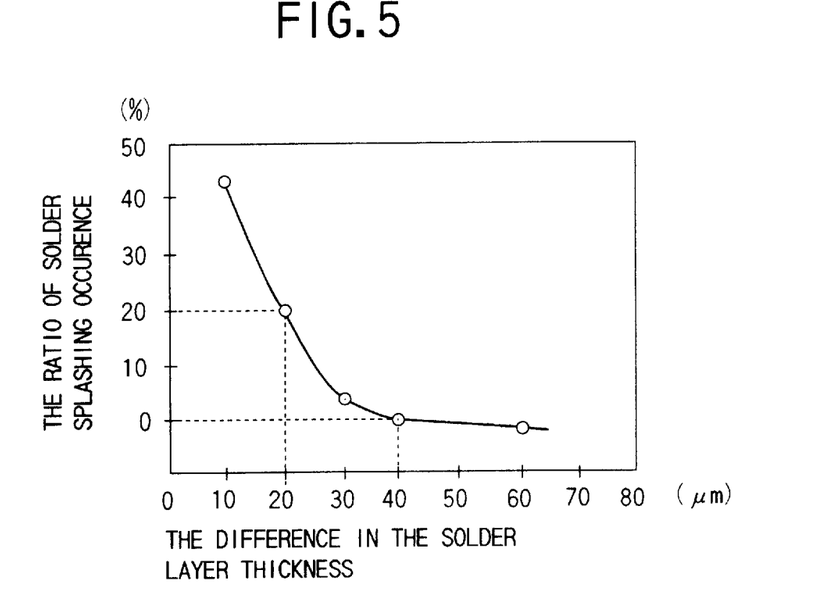
FIG. 5 is a graph illustrating the relation between the difference in the solder layer thickness and the ratio solder splashing occurrence.

It is noted that the difference between the thickness $x_1$ of the solder and the thickness $y_1$ of the solder of the solder layer is preferably 40 $\mu$m or more for a ceramic plate 25 mm by 25 mm in size. This value is obtained by conducting an experiment as to the relation between the difference in the solder thickness of the solder layer and the ratio of solder splashing (splattering) occurrence, as shown in FIG. 5. The solder scattering rate, which is on the order of 20% for a difference in solder thickness of 20 $\mu$m, can be reduced to 0% by increasing the difference in the solder thickness to 40 $\mu$m or more.

The relation between the ratio of the metallized layer width $w_2$ at the corner 11 of the underlying metallized layer 7 to the metallized layer width $w_1$ at the mid portion 12 of the peripheral side ($w_2/W_1$) and difference between the thickness of the solder at the corner 11 and that at the mid portion 12 ($y_1-x_1$) were checked for various values of the widths $w_1$ and $w_2$, with the thickness of the solder at the mid portion 12 being 100 $\mu$m. Thus, it has been revealed that, for providing the difference in the solder thickness of 40 $\mu$m in order to provide a satisfactory solder thickness gradient, it is necessary for the metallized layer width ratio ($w_2/w_1$) to be 1.1 or more, as shown in FIG. 4, and that only a difference in the solder thickness on the order of 30 $\mu$m can be obtained with a metallized layer width ratio ($w_2/w_1$) of 1.0 or less, whereas with a metallized layer width ratio of 1.8 or more the solder is wasted, with the excess solder intruded into the semiconductor chip mounting area at the time of sealing. FIG. 4 also shows the results obtained when the solder thickness (150, 200 $\mu$m) at the mid portion 12 of the peripheral side is changed. Thus, it has been confirmed that a metallized layer width ratio $w_2/w_1$ in the range of 1.1 to 1.7 is preferred, even though the thickness at the mid portion 12 of the peripheral side is changed. It has also been confirmed that, under the above conditions, an optimum difference in solder thickness can be redetermined without the solder being wasted. With the present embodiment, by setting the metallized layer width $w_2$ at the corner 11 to a larger value and the width $w_1$ at the mid portion 12 to a smaller value, the amount of solder of the solder layer at the mid portion 12 may be diminished at the time of sealing, so that it becomes possible to minimize adverse effects on a semiconductor chip mounting portion 14 on a package substrate 13. In addition, it becomes possible to reduce the lid size.

Figure 6:
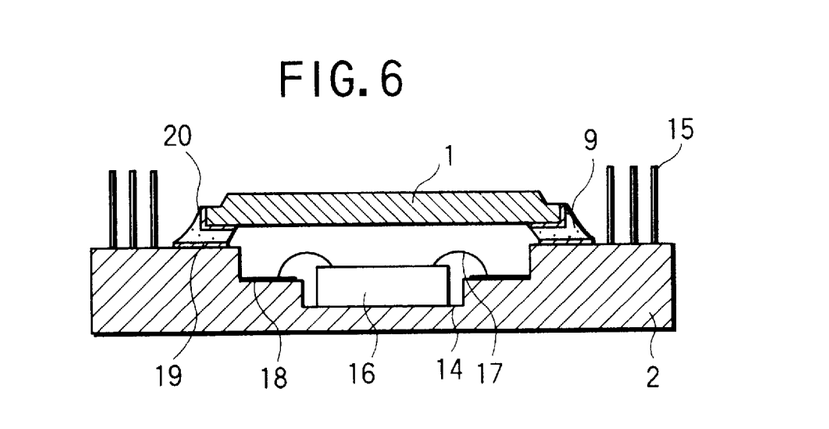
FIG. 6 is a schematic view showing the sealed state of the semiconductor package according to the present invention.
Figure 7A:
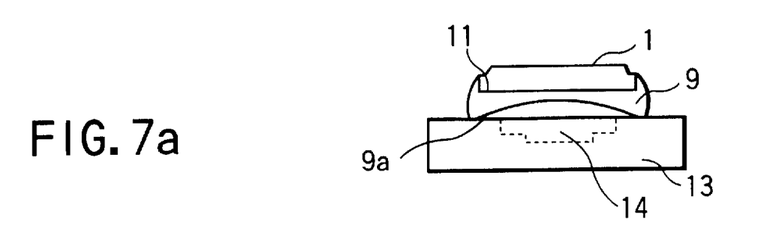
FIG. 7a, 7b and 7c are views illustrating sealing processes in the present invention.
Figure 7B:
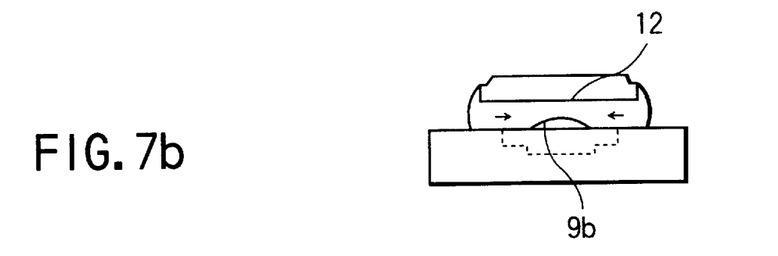
Figure 7C:
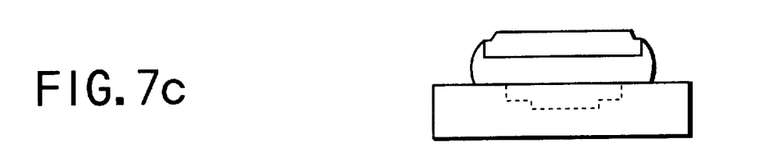

The method of sealing the package substrate 13 using the above-mentioned lid 1 is now explained. Referring to FIG. 6, a metallization layer 19 is formed at a portion on the package substrate 2 in contact with the solder layer 9 of the lid 1. The metallization layer 19 is usually formed by plating Ni on a fired layer of, for example, W or Mo, and further by plating Au thereon. A semiconductor chip 16 is bonded and mounted at a semiconductor mounting area 14 of the package substrate 2, with the aid of die attachment agents. Then, for providing the electrical connection, the semiconductor chip 16 is bonded with a bonding wire 17 to a bonding pattern 18 connected to an external connection terminal 15 through interlayer wiring patterns in the package substrate. The lid 1 is then placed with its solder layer 9 directed downwards, as shown in FIG. 7 and is set in position by a spring, clip or the like. The resulting assembly is put in a furnace maintained at 280° to 320° C. The solder layer 9 is fused to seal the semiconductor chip mounting area 14 of the package substrate by the fusible solder. By visually checking the semiconductor package in the sealed state, it may be seen that at the time of setting, only a portion 9a of the solder layer 9 at the corner 11 having a larger thickness is in contact with the main body of the package 1, with the solder of the portion 9a being spread with wetting towards a portion 9b of the solder layer 9 at the mid portion 12 having a smaller solder thickness. Due to the gradient of the solder thickness, the corner 11 gradually closes and smoothly discharges the gas contained between the lid and the package substrate 13 into the atmosphere, with the narrow path of the mid portion 12 being closed to achieve satisfactory sealing.

From the results of the above experiments, it may be seen that, if the underlying metallized layer on the peripheral side of the ceramic plate has the narrow width portion and the wide width portion, the width $w_1$ of the narrow width portion being related with the width $w_2$ of the wide width portion by $w_2/w_1$ =1.1 to 1.7, a solder layer having a satisfactory gradient of the solder thickness may be produced correctly.

With the semiconductor package sealing lid of the present embodiment, in which the solder layer is comprised of a solder portion of increased thickness and a solder portion of reduced thickness in order to provide a gradient in the solder thickness along the peripheral side, the main body of the package substrates and the ceramic lid are sealed at different times, depending on the sealing location, to permit the gas to be discharged smoothly to the outside under the internal pressure. Besides, the volume of the confined gas may be diminished because the solder is spread with a wetting action during sealing of the package substrate and the ceramic lid from the solder portion of a larger thickness towards the solder portion of a reduced thickness under the gradient of the solder thickness so as to permit the gas to be discharged via a gap between the solder layer of the lid and the package substrate. As a result, splashing or depositing of the solder on the package substrate or the external connection terminal may be precluded, while the semiconductor package may be maintained under an hermetic condition. Since the package making use of the semiconductor package sealing lid of the present embodiment has the above-mentioned advantage, a semiconductor device having superior sealing properties may be produced.

Embodiment 2

Figure 8:
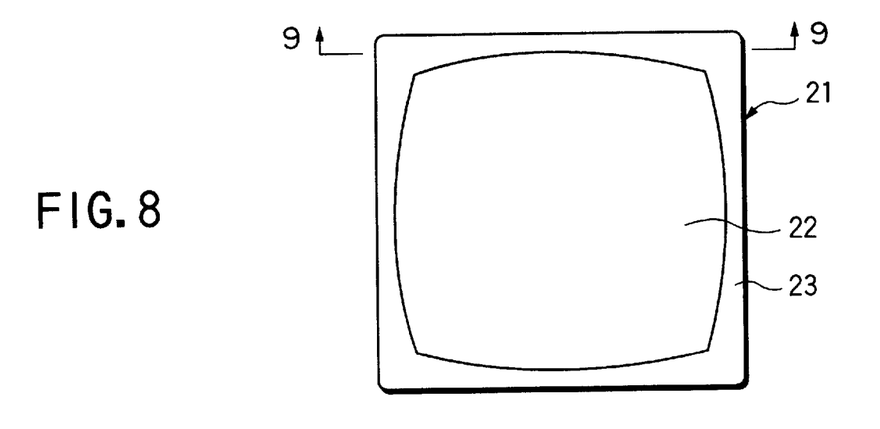
FIG. 8 is a plan view showing the surface of the semiconductor package sealing lid provided with the solder layer according to the present invention.
Figure 9:
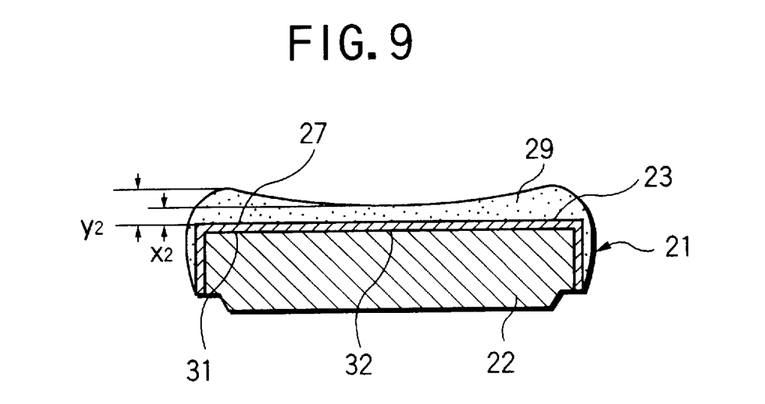
FIG. 9 is a cross-sectional view taken along a line D—D of FIG. 8.

Referring to FIGS. 8 and 9, a lid 21 for a semiconductor package is formed of a ceramic material, and includes an underlying metallized layer 27 on peripheral side 23 on one of the major surfaces of a ceramic plate 22. A solder layer 29 as a sealing component is provided on the underlying metallized layer 27 and has a thickness gradient along the peripheral side 23.

Figure 10:
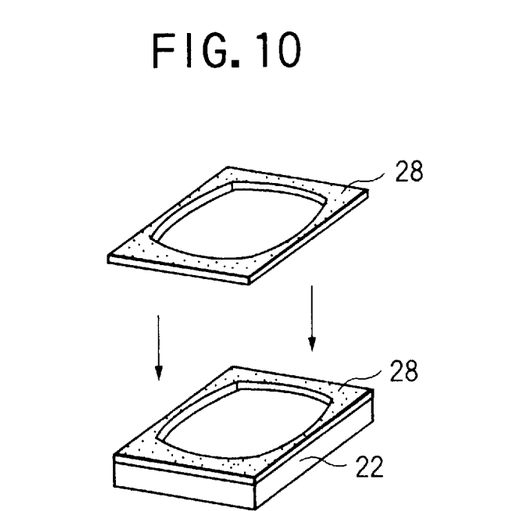
FIG. 10 is a schematic view illustrating a solder preform ring according to the present invention.

The ceramic plate 22 is a rectangular insulating substrate formed of an electrically insulating material, such as an alumina ceramic. The underlying metallized layer 27, formed on the peripheral side 23 of the ceramic plate 22, is formed as a thick-film metallization by coating a paste composed of metals such as Ag, Ag—Pt, Ag—Pd, Mo—Mn, Mo, W or Ti by screen printing, and sintering the resulting assembly. Of these metals, Ag—Pt is most preferred. The metallization is of a thickness of 10 to 20 $\mu$m. When Mo—Mn, Mo, W, or Ti is employed, Ni is plated on the metallized layer, and Au is further plated on the Ni plating. A solder layer 29 free of the flux is formed on the underlying metallized layer or on the Au plating layer, using a solder preform ring 28, as shown in FIG. 10.

The solder layer 29 is of a thickness of 80 to 150 $\mu$m, as an example, and may be formed using a solder preform ring 28 having the same pattern as the underlying metallized layer 27. With this method, it suffices to apply the solder 28 on the underlying metallized layer 27. During such reflowing, a portion with a reduced thickness of the solder layer and a portion with an increased thickness of the solder layer are formed, depending on the width of the underlying metallized layer 27. The solder preform ring 28, melting at 290° to 320° C., is free of the flux and composed, at least in part, of Pb, Sn, In, Bi, Ag or Sb. The solder is fabricated to the same pattern as that of the underlying metallized layer. It is prepared by press-working a solder plate to the same pattern as that of the underlying metallized layer.

The solder layer 29 has a solder thickness $y_2$ at a corner 31 larger than a solder thickness $x_2$ at an peripheral side 32, and is formed with a thickness gradient along the peripheral side 32. The solder thickness of the solder layer varies with the size of the ceramic plate 22. With the 25 mm by 25 mm ceramic plate, the solder thickness $y_2$ at the corner 31 and the solder thickness $x_2$ on the peripheral side 32 are on the order of 190 $\mu$m and 120 $\mu$m, respectively, with the portion with the increased solder thickness and the portion with the reduced solder thickness being smoothly sloped or having a smooth linear gradient, as shown in FIG. 9. The slope or the straight lines may include small meandering portions caused by manufacture tolerances.

It has been shown in Embodiment 1 that, with the 25 mm by 25 mm ceramic plate, the difference between the solder thicknesses $x_1$ and $y_1$ of the solder layer 29 is preferably 40 $\mu$m or more. This value is obtained by an experiment determing the relation between the difference in the solder thicknesses and the ratio of the solder splashing occurrence (FIG. 5). In the present embodiment, if the difference in the solder thicknesses is 20 $\mu$m, the solder splashing ratio is on the order of 20%, whereas, if the difference in the ratio of solder thicknesses is 40 $\mu$m or more, the solder ratio of splashing occurrence may be reduced to zero.

After the semiconductor chip is loaded on the chip loading position of a pin-grid-array (PGA) package substrate and, after wire-bonding, the lid 21 is placed on the upper side of the package substrate. The resulting assembly is placed in a furnace at 270° C. The solder layer 29 is fused in this manner that the chip mounting portion of the semiconductor is sealed by the fusible solder. The gas confined within the inside of the package may be discharged smoothly into the atmosphere in the course of the wetting and spreading of the solder for sealing, as in the previous Embodiment 1.

Embodiment 3

Figure 11A:
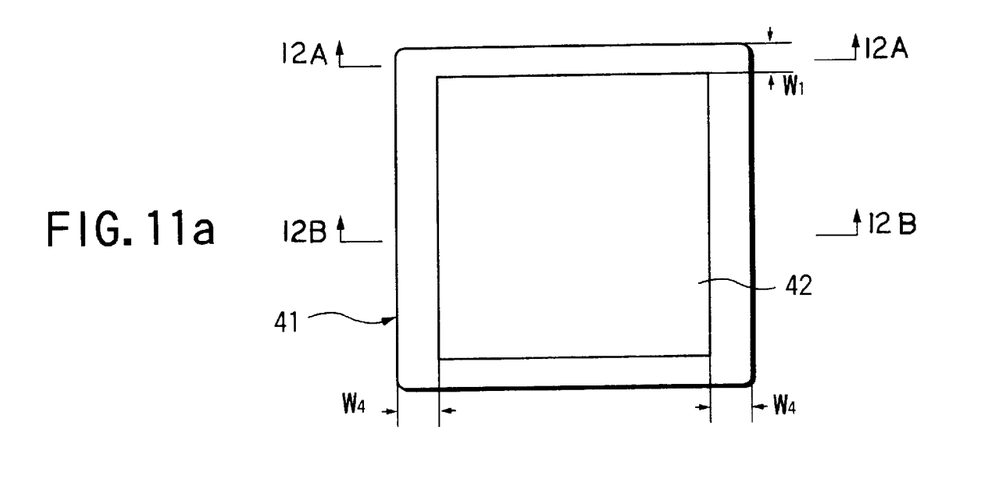
FIGS. 11a and 11b are plan views showing the surface of the semiconductor package sealing lid provided with the solder layer according to modifications of the present invention.
Figure 11B:
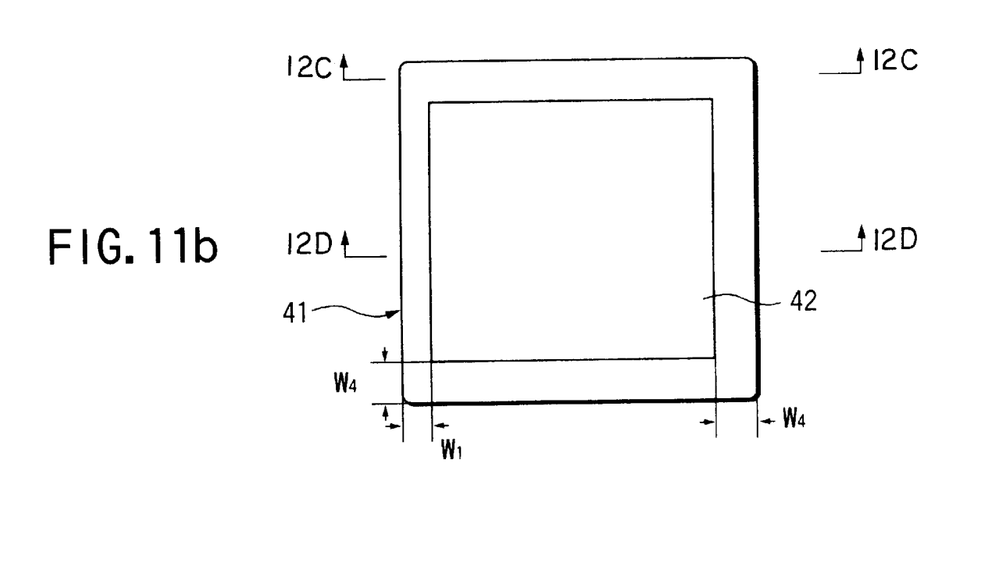

Referring to FIGS. 11 and 12, an underlying metallized layer 47 is formed on an peripheral side 43 on one major surface of a ceramic plate 42, and an underlying metallized layer 48 is formed on a lateral side 44 of the ceramic plate. A solder layer 49, as a sealant is formed on the underlying metallized layer 47, and a solder layer 50 is formed on the underlying metallized layer 48.

Figure 12A:
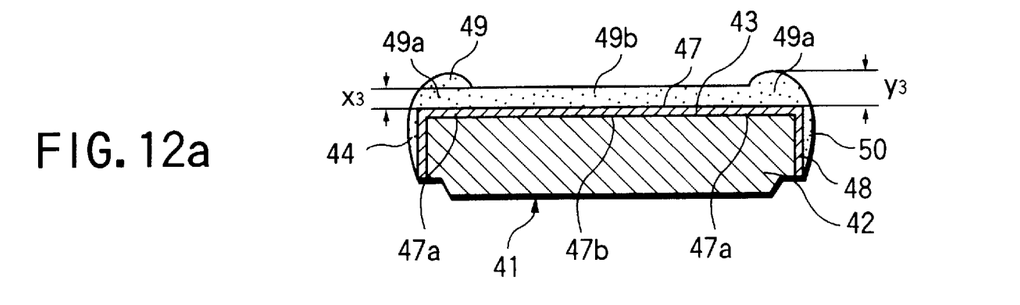
FIGS. 12a to 12d are cross-sectional views taken along lines E—E of FIG. 11a, F—F of FIG. 11a, G—G of FIG. 11b and H—H of FIG. 11b, respectively.
Figure 12B:
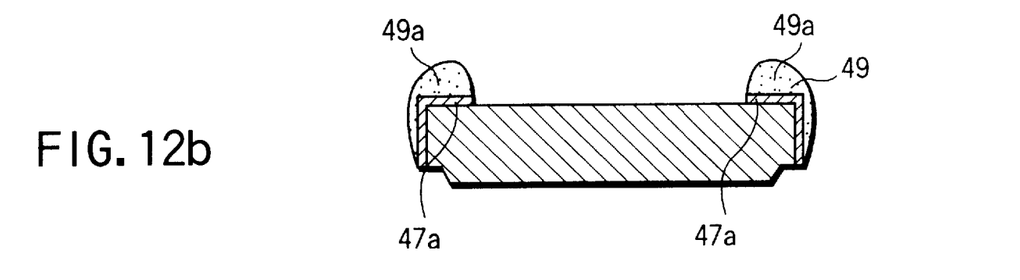
Figure 12C:
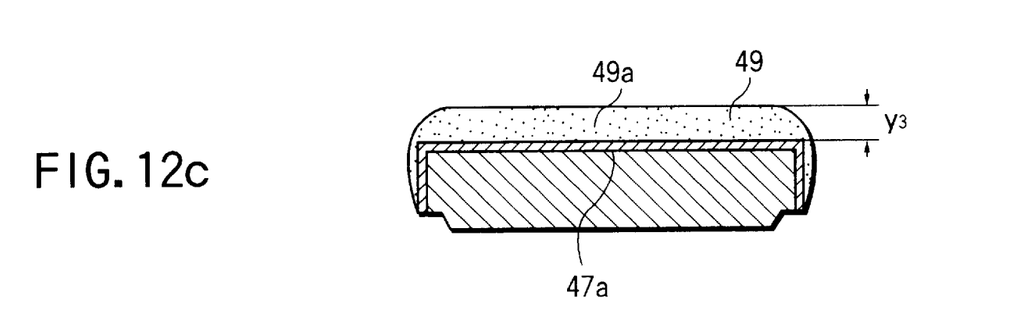
Figure 12D:
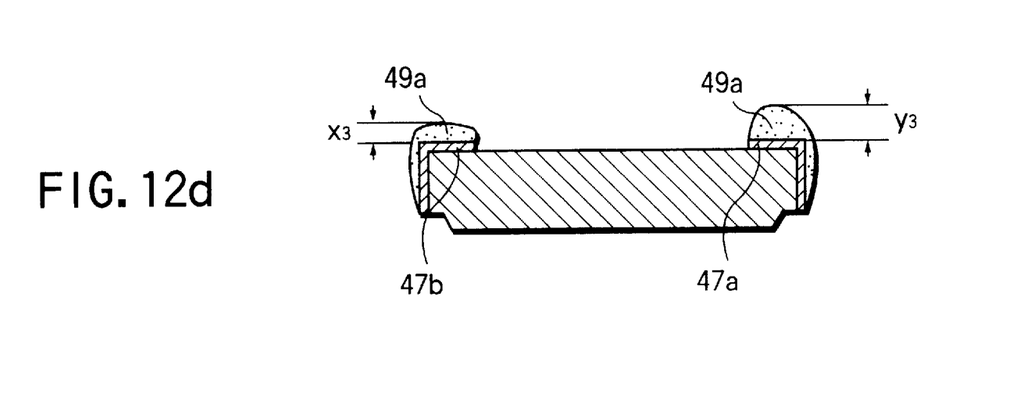

The ceramic plate 42 is rectangular in shape and, as shown in FIGS. 11a, 12a and 12b, the thickness of solder layers 49b on the two opposing sides is selected to be thinner than the thickness of the solder layers 49a on the two remaining sides. Alternatively, as shown in FIGS. 11b, 12c and 12d, the thickness of one solder layer 49b is selected to be thinner than the solder thickness of the three remaining sides. The ceramic plate 42 is rectangular and formed of an electrically dielectric material, such as an alumina ceramic. The underlying metallized layers 47, 48 on the peripheral sides 43 and on the lateral sides 44 are formed by screen printing as the thick-film metallization by coating a paste containing metals such as Ag, Ag—Pt, Ag—Pd, Mo—Mn, Mo, W or Ti and sintering the resulting assembly. Of these metals, Ag—Pt is preferred. The thickness of each of the underlying metallized layers 47, 48 is 10 to 20 $\mu$m. It is noted that the underlying metallized layers 47, 48 are provided since ceramics are not wetted by the solder and hence the solder layer cannot be directly formed on the ceramics.

The solder layers 49, 50, melting at 230° C. or higher, are composed, at least in part, of Pb, Sn, In, Bi, Ag or Sb. The solder layers 49, 50 are formed by screen printing and reflowing a paste containing the solder or by dipping in a solder bath. The solder layer is formed by dipping the lid in a solder bath for about 10 seconds, uplifting and cooling the lid. The temperature of the solder bath composed of Pb, Sn, In, Bl, Ag and Sb, at least in part, is preferably about 300° C. If the ceramic plate is 25 mm by 25 mm in size, the difference between the solder thickness $x_3$ and the solder thickness $y_3$ of the solder layer 49 is preferably 40 $\mu$m or more, as in Embodiment 1.

In consideration that the solder has a constant wetting angle with respect to the underlying metallized layer 47, the difference in the thickness of the solder layer 49 is set such that the widths $w_1$, of an underlying metallized layer 47b of one of the sides or two opposing sides of the ceramic plate 42 are narrower than the width $w_4$ of a metallized layer 47a of the remaining two or three sides. The lid 41 for the semiconductor package of the present embodiment is produced by screen printing a paste containing the solder on the underlying metallized layers 47a, 47b as in Embodiment 1 and allowing the solder to reflow under a nitrogen atmosphere under conditions of a temperature of 270° C. or higher and a reflow time of 20 seconds, with the maximum temperature being 310° C. Since the solder has a constant wetting angle with respect to the underlying metallized layers 47, as explained in Embodiment 1, the solder layer 49a on an underlying metallized layer 47a after the reflow has a solder thickness $y_3$ which is larger than a solder thickness $x_3$ of a solder layer 49b.

For producing the lid for the semiconductor package 41 of the present embodiment, the solder layer 49 is set on the package substrate and heated as in embodiment 1. With a rise in temperature on heating, the solder of a solder layer 49a spreads by wetting over a solder layer 49b of a reduced solder thickness for gradually closing the gap. During such time, the gas confined within the inside of a main body of the package is smoothly discharged to the atmosphere.

In the above embodiments, description has been made of an arrangement in which the portion of increased solder thickness of the solder layer and the portion of reduced solder thickness are connected by a sloped ridge line. However, the ridge line may also be linear. Although the solder thickness at the corners of the ceramic lid is larger than that on the peripheral sides thereof in the above embodiment, the portions of the increased solder thickness may be formed at one to three places or at five or more places on the peripheral sides if the solder exhibits superior wetting and spreading characteristics. In addition, although the width of the underlying metallized layer at the corners of the ceramic plate is selected to be larger than the width of the metallized layer at the mid portion of the ceramic plate, the latter width may also be set so as to be larger than the former width. Although a rectangular dielectric substrate is used as the ceramic plate, and the four peripheral sides of the underlying metallized layer are designed so as to have the narrow width portions $w_1$ and the broad width portions $w_4$, it is also possible to provide the narrow width portion $w_1$ and the broad width portion $w_4$ on only one to three sides, with the remaining sides being of the usual pattern. Furthermore, the ceramic plate may also be polygonal, for example, triangular or pentagonal, in shape, instead of being rectangular, as in the above embodiments. The dielectric substrate may also be circular.

Figure 13:
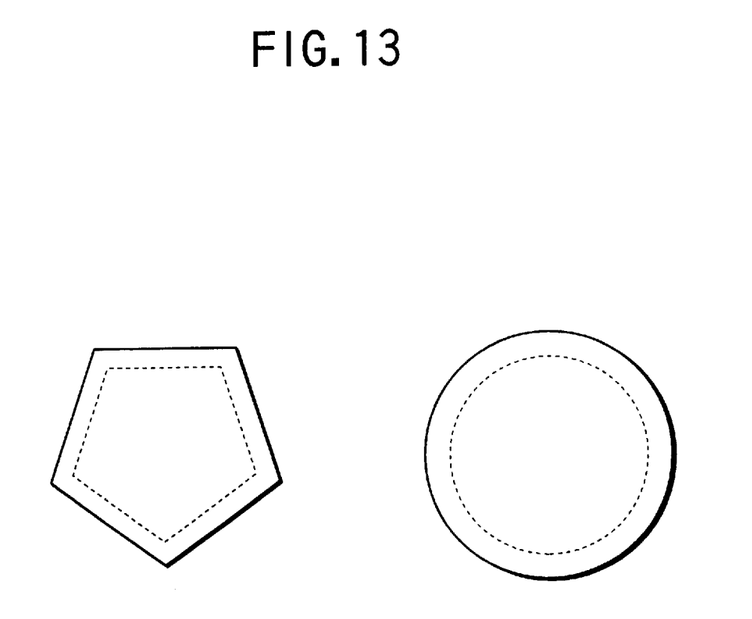
FIG. 13 is a plan view of a ceramic plate according to another embodiment of the present invention.

FIG. 13 is a plan view of a ceramic plate according to another embodiment of the present invention.

Example 4

Figure 14A:
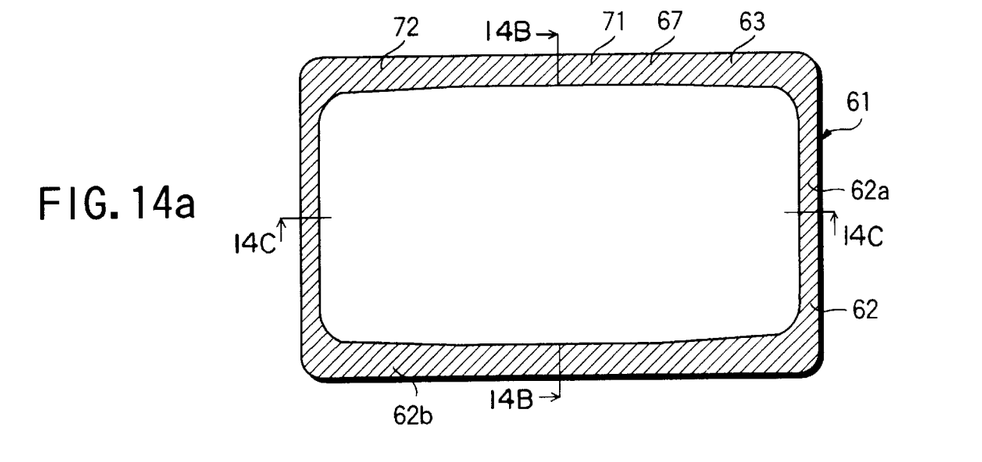
FIG. 14a is a plan view showing a lid for a semiconductor package formed by a rectangular ceramic plate according to another embodiment of the present invention.

Referring to FIG. 14a, a lid 61 for a semiconductor package of the present embodiment includes an underlying metallized layer 67 on an outer peripheral edge 63 on one surface of a ceramic plate 62 and an underlying metallized layer 68 on a lateral surface 64. On the underlying metallized layer 67 is formed a solder layer 69 as a sealant. On the metallized layer 68 is formed a solder layer 70. The thickness of the solder layer 69 is designed to be changed in proportion to a pattern width of the underlying metallized layer 67.

The ceramic plate 62 is a rectangular dielectric substrate formed of an electrically insulating material, such as an alumina ceramic. With the ceramic plate 62, an underlying metallized layer 67a on a short side 62a is of a narrower width than a pattern width of an underlying metallized layer 67b on a long side 62b. In association with these pattern widths, solder layers 69a, 69b are formed on the underlying metallized layers 67a, 67b, respectively. The underlying metallized layer 67a on the short side 62a of the ceramic plate 62 is of a constant pattern width. The underlying metallized layer 67b on the long side 62b of the ceramic plate 62 has a constant pattern width at a mid portion 71 along the length thereof and has a pattern such that the pattern width of a portion 72 interconnecting the mid portion 71 and the short side 62a is increased in a flared pattern.

Figure 14B:
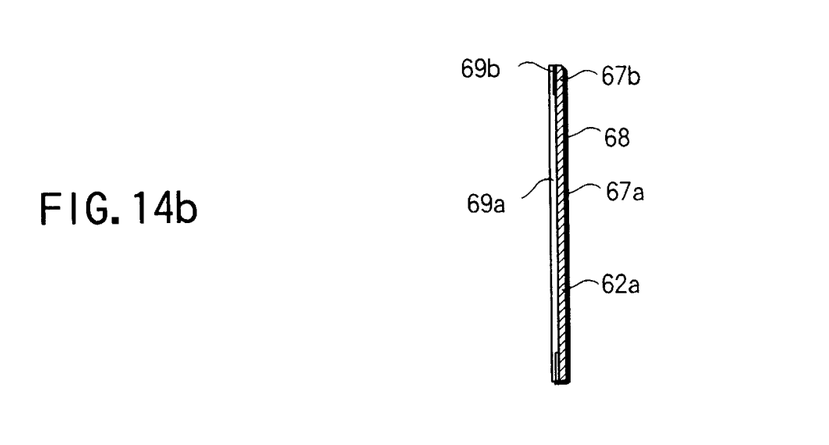
Figure 14C:
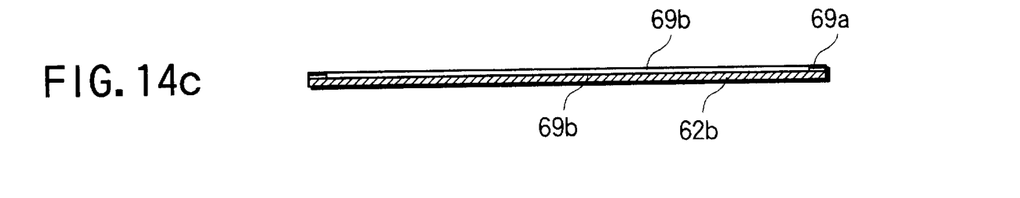

Thus, referring to FIG. 14b, the underlying metallized layer 67a on the short side 62a of the ceramic plate 62 has a narrowest pattern width. The pattern width of the mid portion 71 of the underlying metallized layer 67b on the long side 62b of the ceramic plate 62 is wider than that of the layer 67a. The intersecting portion of the short side 62a and the long side 62b of the ceramic plate 62 has the widest pattern width. That is, the pattern width of a peripheral corner portion 72 of the ceramic plate 62 has the broadest pattern width. As for the thicknesses of solder layers 69a, 69b formed on the underlying metallized layers 67a, 67b, the solder layer thickness is designed to change in proportion to the pattern widths of the underlying metallized layers 67a, 67b, as shown in FIGS. 14b and 14c. Specifically, the solder layer 69a formed on the short side 62a of the ceramic plate 62 is of the smallest thickness. The solder layer 69b formed on the mid portion 71 of the long side 62b of the ceramic plate 62 is of a broader pattern width than the solder layer 69a. The solder layer formed on the intersecting portions of the short side 62a and the long side 62b of the ceramic plate 62 is of the maximum thickness.

As in Example 3 above, the underlying metallized layers 67, 68 are formed as thick metallized films by coating a paste containing metals, such as Ag, Ag—Pt, Ag—Pd, Mo—Mn, Mo, W or Ti by screen printing of these metals, Ag—Pt based metal is most preferred. The film thickness of each of the layers 67, 68 is 10 to 20 µm. These underlying metallized layers 67, 68 are provided in consideration that the solder does not wet a ceramic and hence a solder layer cannot be formed directly on the ceramic.

The solder used for the solder layers 69, 70 melts at 230° C. or higher and has a composition containing part or all of Pb, Sn, In, Bi, Ag and Sb. The solder layers 69, 70 are formed on the underlying metallized layers 67, 68. The solder layers 69, 70 are formed by techniques such as screen printing a solder-containing paste, reflowing or dipping in a solder bath. If the technique of dipping in the solder bath is used, the lid is dipped in a solder bath for about 10 seconds, then uplifted and cooled for forming the solder layers 69, 70. This technique is termed the solder bath dip method. In the case of a Pb—Sn—In—Bi—Ag based solder, the temperature of the soldering bath is preferably on the order of 300° C.

As for the difference in thickness of the solder layer 69, the difference in thickness between the thickness of the solder layer formed at the intersecting portion between the short side 62a and the long side 62b of the ceramic plate 62, where the solder layer thickness is at a maximum, and the thickness of the solder layer 69a formed on the short side 62a of the ceramic plate 62 where the thickness is at a minimum, is preferably 40 µm or more.

In the lid 61 for the semiconductor package of the present embodiment, the differential thickness of the solder layer 69 is decided on the basis of the fact that the solder has a pre-set wetting angle with respect to the underlying metallized layer 67. The lid 61 is prepared as in Example 1 by screen printing a solder-containing paste on the underlying metallized layers 67a, 67b of the ceramic plate having different pattern widths and by allowing the solder to reflow in a nitrogen atmosphere under conditions of a temperature of not lower than 270° C. for 20 seconds, with the maximum temperature being 310° C. Since the solder has a pre-set wetting angle with respect to the underlying metallized layer 67, as explained in Example 1, the solder layers 69a, 69b having thicknesses proportionate to the pattern widths are formed on the underlying metallized layers 69a, 69b after reflowing.

The lid 61 for the semiconductor package of the present embodiment is set on the package substrate and heated, as in Example 1 above. With a rise in temperature, on heating, the solder of the solder layer on the intersecting portion between the short side 62a and the long side 62b of the ceramic plate 62 having the maximum solder layer thickness is spread, caused by wetting, due to the difference in the solder layer thickness, onto the solder layer 69a formed on the short side 62a and onto the solder layer 69b formed on the long side 62b, such that, as the gas confined within the package substrate is discharged, the long side 62b and subsequently the short side 62a of the ceramic plate 62 are sealed. When the sealing of the package comes to an end, the gas contained within the package substrate is completely discharged to the atmosphere. If the ceramic plate 62 has a rectangular plan configuration, during the sealing, the gas confined in the package substrate exerts a pressure in a direction perpendicular to the long side 62b rather than in a direction parallel to it. In the present embodiment, since the pattern width of the underlying metallized layer 67b on the long side 62b of the ceramic plate 62 is selected to be broader than that of the underlying metallized layer 67a on the short side 62a, while the thickness of the solder layer 69b on the long side 62b, of the ceramic plate 62 is selected to be thicker than that of the solder layer 69a on the short side 62a, the gas contained in the package substrate is allowed to flow towards the smallest solder layer thickness area so as to be discharged smoothly out of the package.

The lid of a semiconductor ceramic, formed by the ceramic plate 62 having the rectangular plan configuration, may be arranged as shown in FIGS. 15a to 15d. With the lid of the semiconductor ceramics, shown in FIG. 15a, the pattern width of the underlying metallized layer 80a formed on the opposing short sides 62a and that of the underlying metallized layer 80b formed on the opposing long sides 62b of the ceramic plate 62 are constant, while the pattern width of the underlying metallized layer 80a is selected to be narrower than the pattern width of the underlying metallized layer 80b. Thus the thickness of the solder layer formed on each of the underlying metallized layers 80a, 80b is changed in proportion to the pattern width of each of the underlying metallized layers 80a, 80b. That is, the thickness of the solder layer on the short side 62a of the ceramic plate 62 is set so as to be thinner than that of the solder layer on the long side 62b.

Figure 15A:
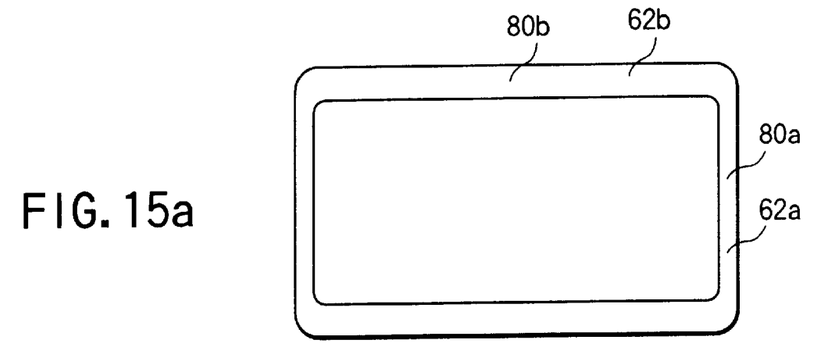
FIGS. 15a to 15d are plan views showing a lid for a semiconductor package formed by a rectangular ceramic plate according to a further embodiment of the present invention.
Figure 15B:
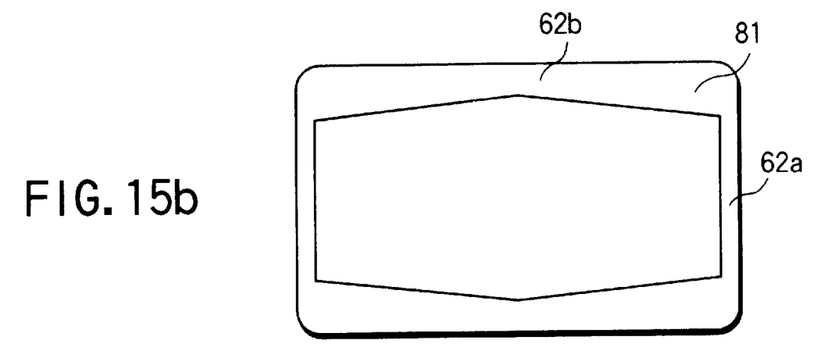
Figure 15C:
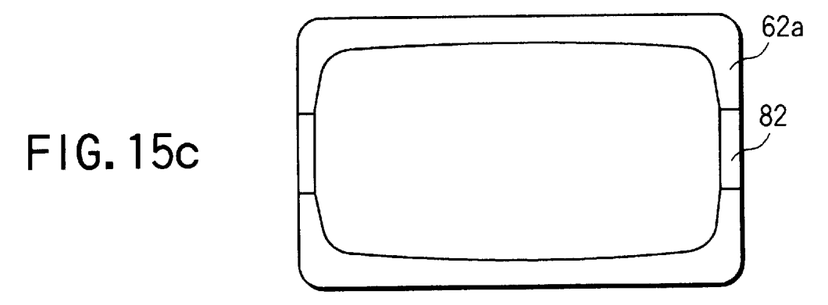
Figure 15D:
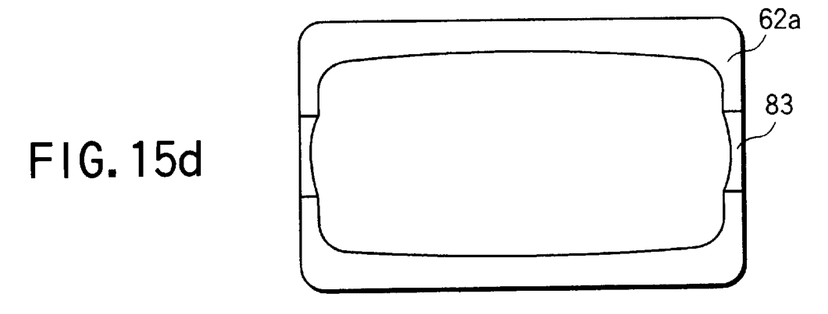

FIGS. 15b to 15d shows lids of semiconductor ceramics which are modified from the lid shown in FIG. 14a. In FIG. 15b, an underlying metallized layer 81 of a flared pattern width is formed at a peripheral corner on the long side 62b and a solder layer having a thickness proportionate to the pattern width of the underlying layer 81 is formed on the underlying metallized layer 81. In FIGS. 15c and 15d underlying metal layers 82, 83, each having a narrower pattern width, are formed at mid portions in the longitudinal direction on the short side 62a, with solder layers having thicknesses proportionate to the pattern widths of the underlying metal layers 82, 83 are formed on the underlying metal layers 82, 83. In the case of the lid of semiconductor ceramics shown in FIGS. 15c and 15d, the gas contained in the package substrate can be discharged more smoothly during the sealing of the package substrate.

It is to be noted that the present invention is not limited to the above described embodiments and may be modified appropriately within the scope of the invention as defined by the claims.

What is claimed is:

1. A semiconductor package having a semiconductor package substrate sealed by a lid for hermetic sealing of the semiconductor package, wherein on the lid adapted for hermetic sealing of the semiconductor package, a ceramic plate rectangular in shape is provided and has a solder layer and an underlying metallized layer on its peripheral area, with the underlying metallized layer on one or two opposing sides of the ceramic plate being narrower than the remaining three sides or remaining two opposing sides and the width of the underlying metallized layer and the solder layer on the short sides of said ceramic plate being constant and narrower than those at the mid portion of long sides of said ceramic plate, and wherein, on the semiconductor package substrate, a metallized layer is formed in register with the solder layer on the lid, with said underlying layer on said lid and said metallized layer on said substrate being hermetically sealed together by the solder layer.

2. The semiconductor package as claimed in claim 1 wherein the underlying metallized layer is formed of Ag—Pt based metal.

3. The semiconductor package as claimed in claim 1 wherein said ceramic plate is rectangular in shape and wherein the underlying metallized layer and the solder layer on the short sides of said ceramic plate are narrower in width than the underlying metallized layer and the solder layer on the long sides of said ceramic plate.

4. The semiconductor package as claimed in claim 1 wherein the solder layer on the periphery of the short sides of said ceramic plate is thinner in thickness than that of the solder layer on the periphery on the long sides of said ceramic plate.

5. A lid for hermetically sealing a semiconductor package, said lid comprising a ceramic plate having an underlying metallized layer provided thereon at peripheral portions thereof and a solder layer provided on the underlying metallized layer, said solder layer having a peak portion and a valley portion formed on at least one peripheral side of the ceramic plate and a sloped transition between the peak portion and the valley portion, the difference in thickness between the peak portion and the valley portion being at least 40 µm.

6. The lid of claim 5, wherein the underlying metallized layer and the solder layer at the peripheral side have wide portions and narrow portions along the peripheral side and a width $W_1$ of a narrow portion of the underlying metallized layer and a width $W_2$ of a wide portion of the underlying metallized layer bear a ratio $W_2/W_1$ equal to 1.1 to 1.7.

7. The lid as claimed in claim 6 wherein the underlying metallized layer at a mid portion between neighboring corners of the ceramic plate is narrower in width and wherein the ceramic plate at said corners is broader in width.

8. The lid as claimed in claim 5 wherein the ceramic plate is rectangular and the thickness of the solder layer at a corner of the ceramic plate is larger than that at the mid portion of the peripheral side of the ceramic plate.

9. The lid as claimed in claim 5 wherein the ceramic plate is rectangular in shape and wherein the underlying metallized layer and the solder layer on the short sides of said ceramic plate are narrower in width than the underlying metallized layer and the solder layer on the long sides of said ceramic plate.

10. The lid as claimed in claim 5 wherein the ceramic plate is rectangular in shape and wherein the widths of the underlying metallized layer and the solder layer on the short sides of said ceramic plate are constant and narrower than the widths of the underlying metallized layer and the solder layer on the long sides of said ceramic plate.

11. The lid as claimed in claim 5 wherein the ceramic plate is rectangular in shape and the solder layer on the short sides of said ceramic plate is smaller in thickness than that on the long sides of said ceramic plate.

12. The lid as claimed in claim 5 wherein the underlying metallized layer is formed of Ag—Pt based metal.

13. The lid as claimed in claim 5 wherein said ceramic plate is square or rectangular in shape and wherein the solder layer on outer peripheral corners of said ceramic plate is larger in thickness than the solder layer on outer peripheral side walls which form the sidewalls of said ceramic plate.

14. The lid as claimed in claim 5 wherein the underlying metallized layer at a mid portion between neighboring corners of the ceramic plate are narrower in width than those at the neighboring corners of the ceramic plate.

15. A lid for hermetically sealing a semiconductor package, said lid comprising a rectangular ceramic plate having an underlying metallized layer provided thereon at peripheral portions thereof and a solder layer deposited on the underlying metallized layer at peripheral sides thereof, said peripheral sides being two pairs of opposing sides, the thickness of the solder layer on one or two opposing sides of said ceramic plate being at least 40 $\mu$m less than the thickness of the solder layer on the remaining peripheral sides.

16. The lid as claimed in claim 15 wherein said underlying metallized layer is formed of Ag—Pt based metal.

17. The lid as claimed in claim 15 wherein the width of the underlying metallized layer and the solder layer on the short sides of said ceramic plate is narrower than that of said underlying metallized layer and said solder layer on the long sides of said ceramic plate.

18. The lid as claimed in claim 15 wherein the width of the underlying metallized layer and the solder layer on the short sides of said ceramic plate are constant and narrower than those of the underlying metal layer and the solder layer at mid portions in the longitudinal direction on the long sides of said ceramic plate.

19. The lid as claimed in claim 15 wherein the solder layer on the short sides of said ceramic plate is thinner in thickness than that on the periphery of the long sides of the ceramic plate.

\* \* \* \* \*